(12) United States Patent
Hanemann et al.

(10) Patent No.: US 6,573,020 B1
(45) Date of Patent: Jun. 3, 2003

(54) METHOD FOR PRODUCING SMALL AND MICRO-SIZED CERAMIC PARTS

(75) Inventors: Thomas Hanemann, Stutensee (DE); Jürgen Hausselt, Germersheim (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 105 days.

(21) Appl. No.: 09/677,714

(22) Filed: Sep. 30, 2000

Related U.S. Application Data

(63) Continuation-in-part of application No. PCT/EP99/01476, filed on Mar. 8, 1999.

(30) Foreign Application Priority Data

Apr. 9, 1998 (DE) .......................... 198 15 978

(51) Int. Cl.⁷ ........................... G03F 7/40; G03F 7/075; C08F 2/46
(52) U.S. Cl. ...................... 430/198; 430/311; 430/313; 430/322; 430/325; 430/330; 427/487; 427/493; 427/503
(58) Field of Search ................................ 430/198, 311, 430/313, 322, 325, 330; 427/487, 493, 503

(56) References Cited

U.S. PATENT DOCUMENTS

| 4,133,689 | A | * | 1/1979 | Stroke .......................... 501/88 |
| 4,955,135 | A | * | 9/1990 | Pinkhasov .................. 29/527.2 |
| 5,238,787 | A | * | 8/1993 | Haluska et al. ............. 430/325 |
| 5,386,006 | A | * | 1/1995 | Matsumoto et al. ........... 528/4 |
| 5,639,413 | A |   | 6/1997 | Crivello ..................... 264/401 |

FOREIGN PATENT DOCUMENTS

| EP | 0 510 872 |   | 10/1992 |
| EP | 1239332 | * | 9/2002 |
| JP | 8-134218 | * | 5/1996 |
| JP | 2000-199963 | * | 7/2000 |

* cited by examiner

Primary Examiner—Mark F. Huff
Assistant Examiner—Nicole Barreca
(74) Attorney, Agent, or Firm—Klaus J. Bach

(57) ABSTRACT

In a method for the manufacture, by means of lithography, of ceramic small and micro-parts, a pre-ceramic silicon containing polymer layer is deposited on a highly temperature resistant substrate and then dried at room temperature. The layer is then exposed in an image pattern to electromagnetic radiation and the exposed layer is developed in an organic solvent to remove the non-exposed areas. The preparation is then pyrolyzed at more than 900° C. and finally sintered at a temperature of at least 1600° C. to form a ceramic structured layer on the substrate.

6 Claims, No Drawings

METHOD FOR PRODUCING SMALL AND MICRO-SIZED CERAMIC PARTS

This is a continuation-in-part application of international application PCT/EP99/01476 filed Mar. 8, 1999 and claiming the priority of German application 198 15 978.1 filed Apr. 9, 1998.

BACKGROUND OF THE INVENTION

The invention relates to a method for producing small and micro-sized ceramic parts by lithography. A shaping or working (for example, the micro-structuring) of ceramic materials is practically impossible after sintering because the material is then too hard and too brittle.

It is therefore necessary to develop machining processes for the ceramic base material before sintering while it is present as a lower viscosity organic or inorganic solvent or as a wax or thermoplastic material matrix. Ceramic microstructures with structural details <100 μm and an aspect ratio (ratio of height of structure to the lateral dimension) greater than 1 can be manufactured therefore only with relatively expensive processes. The LIGA process (x-ray depth lithography, galvanic forming and molding), which was developed at the Forschungszentrum Karlsruhe, has, until recently, permitted only the direct manufacture of microstructures from metal and plastic materials by the use of PMMA resist materials. These plastic microstructures can be copied as lost negative molds in an additional process step by means of foil casting, stamping, dross pressing or centrifugal molding into ceramics, [1]:(J. Ritzhaupt-Kleissel, Keramik in der Mikrotechnik-Werkstoffe, Verfahren and Anwendungen, 3. Statuskolloquim des Projektes Mikrosystemtechnik, 02./03.04.1998, Karlsruhe). Further development of the ceramic injection molding for the requirements of micro-forming procedures (machine techniques, powder size, binder sytems etc.) lead to ceramic hot casting (waxes as binders) or respectively, to ceramic micro-injection molding (thermoplastics or respectively, thermoplastics/wax mixtures as binders). [2]: Stadel, H. Freimuth, V. Hessel, M. Lacher, Abformung kermischer Mikrostukturen durch die LIGA-Technik, Keram. Z. 48(12), 1112ff, (1996); [3]: Plotter, T. Benzler, J. Hausselt, R. Ruprecht, MIM und CIM-Neue pulvertechnologische Verfahren in der Mikrotechnik, 3. Statuskolloquium des Projektes Mikrosystemtechnik, 02./03.04.1998, Karlsruhe.

The organic binder must be removed at raised temperatures and the remaining powder structure must be sintered to form stable micro-structured parts. Because the ceramic powder mixture (feedstock) must be capable of flowing during hot casting or injection molding the ceramics content can be only relatively low (50–70% vol.). As a result, the parts shrink during sintering by 30–50% of the mold which must be taken into consideration during design. The use of a pre-ceramic polymer material as binder which, after forming of the part, is pyrolized by heating to raised temperatures to be converted to a ceramic reduces the shrinking during sintering [2]: Stadel, H. Freimuth, V. Hessel, M. Lacher, Abformung kermischer Mikrostukturen durch die LIGA-Technik, Keram. Z. 48(12), 1112ff, (1996). However, the pre-ceramic polymers have generally a chemical instability to moisture in the air so that the injection molding and casting must be performed under controlled conditions [4]: Hessel, H. Freimuth, M. Stadel, M. Lacher, W. Ehrfeld, Fabrication of Complex Ceramic Microstructures from Powder Ceramics and Preceramic Polymers, *Tagungsband Micro Materials* (*Micro Mat* '97), 16–18.04.1997, Berlin, 370ff.]

All these processes further require a micro-structured master mold of metal (molding appliance) or of plastic (lost mold)—in contrast to the process according to the invention. In the last-mentioned case, the master mold is subjected to the pyrolizing step with the ceramic component part disposed thereon.

In the microelectronic and micro-technical art, radiation sensitize plastic materials and polymers are known which are used in lithographic procedures as photo-resists and whose solubility is changed by the irradiation. The manufacture of microstructures by lithographic procedures requires in principle four processing steps that is the coating by lacquer (spin-coating) the imaging exposure to electromagnetic (actinic) radiation through a mask provided with a structure, the developing, and, in addition, generally a subsequent thermal treatment at raised temperatures for the removal of residual solvents in the polymer film and to improve the adhesion to the substrate. Generally, during the radiation exposure, polymerketes are destroyed and, consequently, the molecular weight of the polymer is reduced whereby the solubility of the polymer which was originally insoluable in corresponding organic solvents has an increased solubility with respect to the material which was not exposed to the radiation. After the development procedure, the non-exposed polymer which converts the two-dimensional relief picture of the mask to a three-dimensional polymer structure, remains on the substrate. With such positive resists, homogeneous layers with a thickness of over 100 μm can be made. The irradiation of negative resist materials leads to a transverse netting by polymerization or, respectively, polycondensation of the polymers or, respectively, oligomers. The solubility is substantially reduced thereby. The development with a solvent results therefore in an inverse mask structure since the unexposed areas of the resist are dissolved. With this method, plastic microstructures can be made lithographically in a direct way.

Pre-ceramic polymers are used for example in the manufacture of ceramic filters such as silicon carbide, silicon nitride, silicon carbon-nitride, and others. [5]: Vaahs, M. Brück, W. D. G. Böcker, Polymer-derived Silicon Nitride and Silicon Carbon nitride Fibers, *Adv. Mater.* 4(3), 224ff (1992). The treatment of the pre-ceramic polymers by moist air or at raised temperatures (below 500° C.) results in a transverse netting and, as a result, in an insolubility in solvents. This is followed by a conversion to the ceramic state at temperatures of 1000–1200° C. Pre-ceramic polymers may also be hardened by electromagnetic irradiation such as UV radiation, x-radiation or electron radiation. The UV induced transverse lattice-like polymerization of polysilicones in an oxidizing atmosphere (air, oxygen) at a temperature of less than 200° C. with the use of a photo-mask for producing a structure is used for example for producing a temporary protective layer (thickness less than 1 μm) on semiconductor elements or similar devices [6]: JP 05 088373]. Ceramics made in accordance with this oxidizing process have a relatively low mechanical and thermal stability because of a relatively high oxygen content.

EPA-A 0510 872 discloses a process for converting silicon-containing polymers to ceramics by pyrolysis. However, stable small and micro-parts can not be produced alone by pyrolysis.

It is the object of the present invention to provide a method by which ceramic structures with high thermal and mechanical stability can be produced.

SUMMARY OF THE INVENTION

In a method for the manufacture, by means of lithography, of small and micro-parts consisting of ceramics, a preceramic silicon containing polymer layer including at least one of boron-, carbon-, phosphorus-, oxygen-, nitrogen-, and hydrogen- atoms is deposited on a highly temperature resistant substrate and then dried at room temperature; the layer is then exposed in an image pattern to electromagnetic radiation and then developed in an organic solvent to remove the non-exposed areas. The parts are then pyrolyzed at more than 900° C. and then sintered at a temperature of at least 1600° C. to form a ceramic structured layer on the substrate.

The method according to the invention permits the direct manufacture of ceramic microstructures from pre-ceramic polymers without the need for an intermediate molding step by x-ray depth or, respectively, UV lithography. The processing steps described below are performed at room temperature (25° C.):

Spin coating: The pre-ceramic polymer or, respectively, a solution thereof in a solvent (for example, toluene, xylol) is spun onto a high-temperature resistant substrate (for example, 4" aluminum oxide wafer). The desired layer thickness can be adjusted by way of the spinning conditions (start up ramp, speed). Subsequently, the film needs to be dried in order to remove the residual solvent. The film must not be baked at raised temperatures. The pre-ceramic polymer is applied to the substrate in pure form, that is, without solvent or as a solution in a solvent by spin coating, spin casting or painting.

Exposure: Highly parallel x-ray or respectively, UV radiation with a wavelength of less than 400 nm and preferably between 300 and 400 nm can be used for the irradiation of the polymer film through a lithographic mask. These highly parallel x-rays can be generated for example by a synchrotron. The preferred wavelength is smaller than 1 nm.

Development/etching: After exposure the unexposed areas of the film are removed by an organic solvent of a suitable polarity (for example, acetone, chloroform, dioxan, isopropanol, toluene), whereby the unexposed areas of the pre-ceramic polymer are dissolved by the solvent. It is important in this connection that the solvent is highly selective.

Pyrolysis: The undissolved pre-ceramic polymer is subjected, under a protective gas cover or a reaction gas cover, (helium, organ, nitrogen, ammonia) or in a vacuum, to a pyrolysis between 900 and 1200° C. for 0.5 to 2 hours to convert to a ceramic.

Sintering: A stable body is obtained after a sintering procedure at temperatures of up to 2000° C. preferably 1600–2000° C. for 0.5 to 2 hours.

These process steps combine the excellent structuring capabilities of polymers with the advantageous mechanical thermal and chemical properties of the functional ceramic and represents a new direct method for the manufacture of ceramic microstructures. Highly temperature resistant and chemically inert ceramic micro parts for application for example in the chemical micro-engineering field (ceramic reactors, mixers, etc) can be manufactured directly and relatively inexpensively by lithographic procedures. In addition, the procedures described above permit rapid prototyping of micro-structured ceramic components since CAD data can be converted directly by means of lithographic procedures to ceramic prototypes.

The invention will be described below in greater detail on the basis of three examples.

EXAMPLE 1

An aluminum oxide substrate (diameter 30 mm) was coated with a freshly prepared polycarbon silazane solution (80 wt % toluene) by spin coating. After aging of the polymer in air (2 days), the preparation was exposed in a UV exposure apparatus Uvaprint 150 CM (H radiator) through a UV lithographic mask (20–80 minutes). As test structure, a simple cross-structure was selected in which the smallest structural details have a size of 50 $\mu$m. Subsequently, the samples were cooled to room temperature and immediately developed in acetone (residence time in the developing bath 2–30 minutes depending on the exposure time). The microstructures formed in the developing process were pyrolyzed in a nitrogen atmosphere at 1000° C. to form silicon carbon nitride, followed by a sintering process at 1700° C.

EXAMPLE 2

Standard aluminum oxide wafers (diameter 4") were coated by a freshly, prepared polycarbon silazane solution (80 wt % toluene) by spin coating (layer thickness 40 $\mu$m) The polymer films were subsequently aged in air for one day and then stored under nitrogen. Using an x-ray lithography mask (test structures: rings of various thicknesses) the coated wafers were irradiated by x-radiation from an synchrotron, radiation source (wave length<1 nm with a depth dose of 4–12 kJ/cm$^3$) and subsequently immediately developed in chloroform (1–10 minutes, depending on the depth dose applied). Structural details<70 $\mu$m of very good quality were obtained after the development procedure. The pyrolysis to form the ceramic microstructure was performed in the same manner as described for example 1. The subsequent sintering was done at 1700° C. The identification of the silicon carbon nitride ceramic was made be EDX.

EXAMPLE 3

Standard aluminum wafers (diameter 4") were coated with a freshly prepared polycarbon silazane solution (80 wt % toluene) by spin coating (coating thickness 40 $\mu$m). After manufacture, the polymer films were aged in air for one day and then stored in a nitrogen atmosphere. Using an x-ray depth lithography mask (test structures: circular rings of different thicknesses) the coated wafers were irradiated by a synchrotron radiation source (depth-dose 4–12 kJ/cm$^3$) and subsequently immediately developed in chloroform (1–10 min, each after preceding applied depth dose). Structural details<70 $\mu$m of good quality were obtained after the developing procedure. The pyrolysis to form the microstructures occurred in an ammonia atmosphere at 1000° C. Sintering was performed like in the other examples. The micro-structured ceramics were identified as silicon nitride by means of EDX.

LITERATURE

[1] (J. Ritzhaupt-Kleissel, Keramik in der Mikrotechnik-Werkstoffe, Verfahren and Anwendungen, 3. *Statuskolloquim des Projektes Mikrosystemtechnik,* 02./03.04.1998, Karlsruhe)

[2] Stadel, H. Freimuth, V. Hessel, M. Lacher, Abformung keramischer Mikrostukturen durch die LIGA-Technik, Keram. Z. 48(12), 1112ff, (1996).

[3] Plotter, T. Benzler, J. Hausselt, R. Ruprecht, MIM und CIM-Neue pulvertechnologische Verfahren in der Mikrotechnik, 3. Statuskolloquium des Projektes Mikrosystemtechnik, 02./03.04.1998, Karlsruhe.

[4] Hessel, H. Freimuth, M. Stadel, M. Lacher, W. Ehrfeld, Fabrication of Complex Ceramic Microstructures from Powder Ceramics and Preceramic Polymers, *Tagungsband Micro Materials* (*Micro Mat '97*), 16–18.04.1997, Berlin, 370ff.

5. [Vaahs, M. Brück, W. D. G. Böcker, Polymer-derived Silicon Nitride and Silicon Carbonitride Fibers, *Adv. Mater.* 4(3), 224ff (1992).
6. JP 05088373

What is claimed is:

1. A method for the manufacture of small and micro-parts consisting of ceramics by means of lithography, comprising the following steps:

depositing a pre-ceramic silicon-containing, polymer layer including at least one of the group consisting exclusively of at least one of the group of boron-, nitrogen-, and phosphorus atoms on a high temperature resistant substrate, drying said layer at room temperature to provide a polymer-coated substrate, exposing said pre-ceramic polymer-coated substrate to electromagnetic radiation in the form of an image, developing said polymer-coated exposed substrate in an organic solvent so as to dissolve unexposed areas of the polymer layer, pyrolyzing the polymer layer on the substrate at a temperature of more than 900° C., and then sintering the polymer layer at a temperature of at least 1600° C. to provide a form-stable three-dimensional ceramic body structure.

2. A method according to claim 1, wherein said pre-ceramic polymer is applied to the high temperature resistant substrate in pure form or as a solution in a solvent by spin-coating, spin casting or painting.

3. A method according to claim 1, wherein said electromagnetic radiation is a parallel UV light or synchrotron radiation.

4. A method according to claim 1, wherein the substrate provided with the pre-ceramic polymer is developed, after exposure, in an organic solvent of suitable polarity, whereby the unexposed areas of the pre-ceramic polymer are dissolved by the solvent.

5. A method according to claim 1, wherein the pyrolysis is performed at a temperature of between 900° C. and 1200° C. over a period of 0.5–2 hours under vacuum or under an inert gas cover, a nitrogen cover or an ammonia cover to produce a ceramic.

6. A method according to claim 1, wherein the pyrolized polymer layer is sintered at temperatures of 1600° C.–2000° C. for 0.5–2 hours to provide a form stable ceramic structure.

* * * * *